United States Patent … US 8,907,667 B2
Klein et al.                     (45) Date of Patent:    Dec. 9, 2014

(54) GENERATOR OF A HOMOGENOUS MAGNETIC FIELD

(75) Inventors: Philippe Klein, Saint Pierre d'Allevard (FR); Christian Jeandey, Saint-Egreve (FR)

(73) Assignee: Commissariat a l'energie atomique et aux énergies alternatives, Paris (FR)

( * ) Notice: Subject to any disclaimer, the term of this patent is extended or adjusted under 35 U.S.C. 154(b) by 270 days.

(21) Appl. No.: 13/606,606

(22) Filed: Sep. 7, 2012

(65) Prior Publication Data

US 2013/0057270 A1    Mar. 7, 2013

(30) Foreign Application Priority Data

Sep. 7, 2011 (FR) ..................... 11 57949

(51) Int. Cl.
| | | |
|---|---|---|
| G01R 33/02 | (2006.01) | |
| G01R 33/04 | (2006.01) | |
| H01F 5/00 | (2006.01) | |
| H01F 7/20 | (2006.01) | |
| H01F 5/02 | (2006.01) | |

(52) U.S. Cl.
 CPC ............... G01R 33/04 (2013.01); H01F 5/003 (2013.01); H01F 7/20 (2013.01); H01F 2005/027 (2013.01)
 USPC ......................................... 324/244; 324/253

(58) Field of Classification Search
 CPC .... G01R 33/1276; G01R 33/28; G01R 33/44; G01R 33/04; H01F 2005/027; H01F 5/003
 USPC ......... 324/239–244, 249, 252, 253, 255–258, 324/260
 See application file for complete search history.

(56) References Cited

U.S. PATENT DOCUMENTS

| | | | |
|---|---|---|---|
| 7,372,261 B2 * | 5/2008 | Choi et al. | ..................... 324/253 |
| 2002/0057171 A1 | 5/2002 | Patel et al. | |
| 2006/0001422 A1 | 1/2006 | Kang et al. | |
| 2008/0012559 A1 | 1/2008 | Heiland | |
| 2010/0308811 A1 | 12/2010 | Wallauer | |

FOREIGN PATENT DOCUMENTS

| | | |
|---|---|---|
| DE | 10148288 | 4/2003 |
| EP | 1481637 | 12/2004 |
| EP | 1873543 | 1/2008 |
| EP | 2259081 | 12/2010 |

(Continued)

OTHER PUBLICATIONS

DE 10148288, English Machine Translation.*

*Primary Examiner* — Jermele M Hollington
*Assistant Examiner* — Raul Rios Russo
(74) *Attorney, Agent, or Firm* — Occhiuti & Rohlicek LLP

(57) ABSTRACT

A generator having at least four coils wound around each of the winding axes, these four coils being spaced out from one another to cancel at least the first derivative up to the seventh derivative of the magnetic field generated by these coils, in parallel to the winding axis, at a central point when they are powered by the same current, and the circumference of each coil is a circle, the diameter of this circle being equal within 2% of the diameter of a circle defined by the intersection between a sphere centered on the central point and a plane, perpendicular to the winding axis of this coil, passing through this coil, the sphere being the same for all the coils wound around the same winding axis.

9 Claims, 5 Drawing Sheets

(56) References Cited

FOREIGN PATENT DOCUMENTS

| | | | |
|---|---|---|---|
| EP | 10194492 | * 12/2010 | ............. G01R 33/12 |
| FR | 1157933 | 6/1958 | |
| JP | 2002232182 | 8/2002 | |
| JP | 2005294537 | 10/2005 | |

* cited by examiner

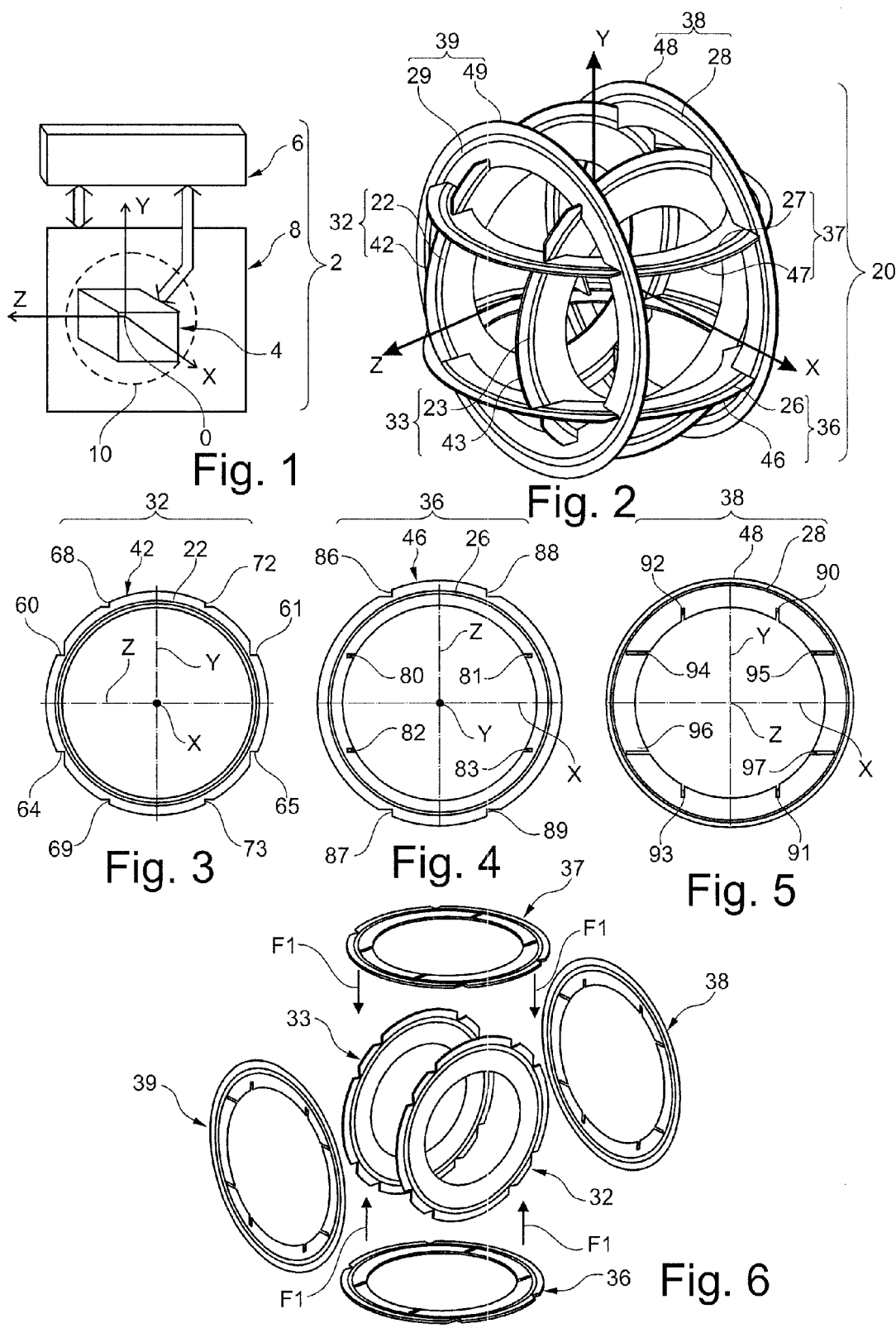

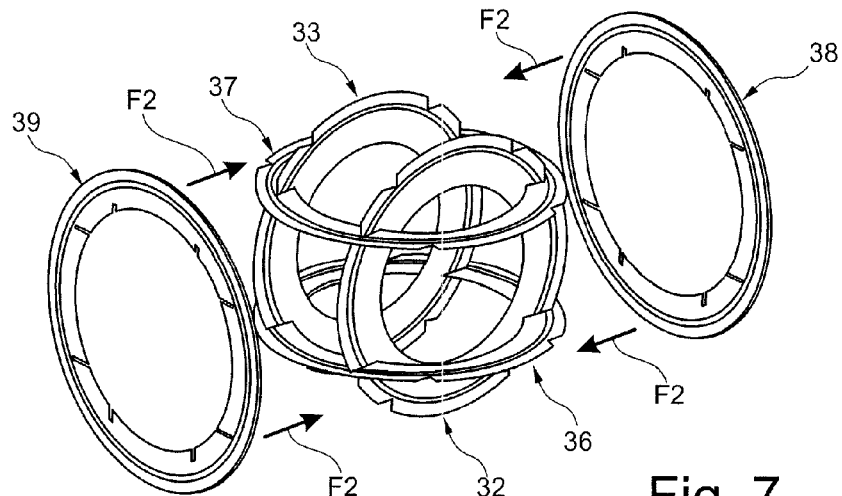
Fig. 7
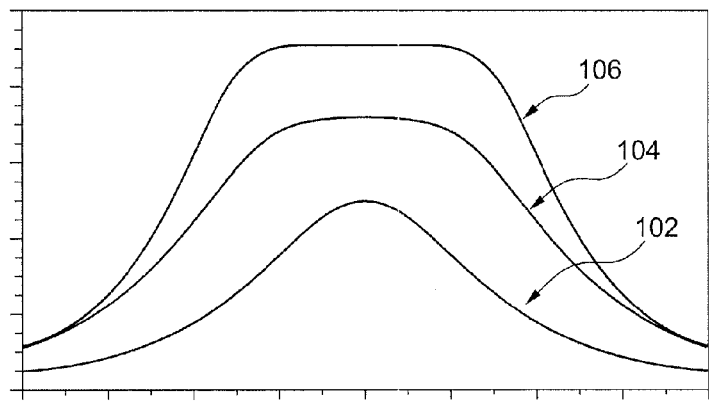
Fig. 9
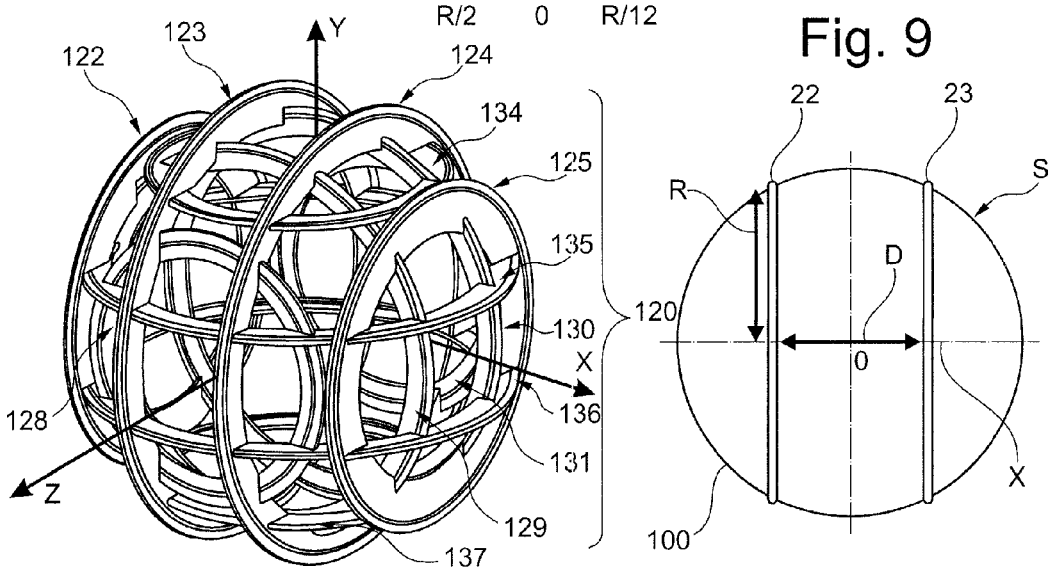
Fig. 10
Fig. 8

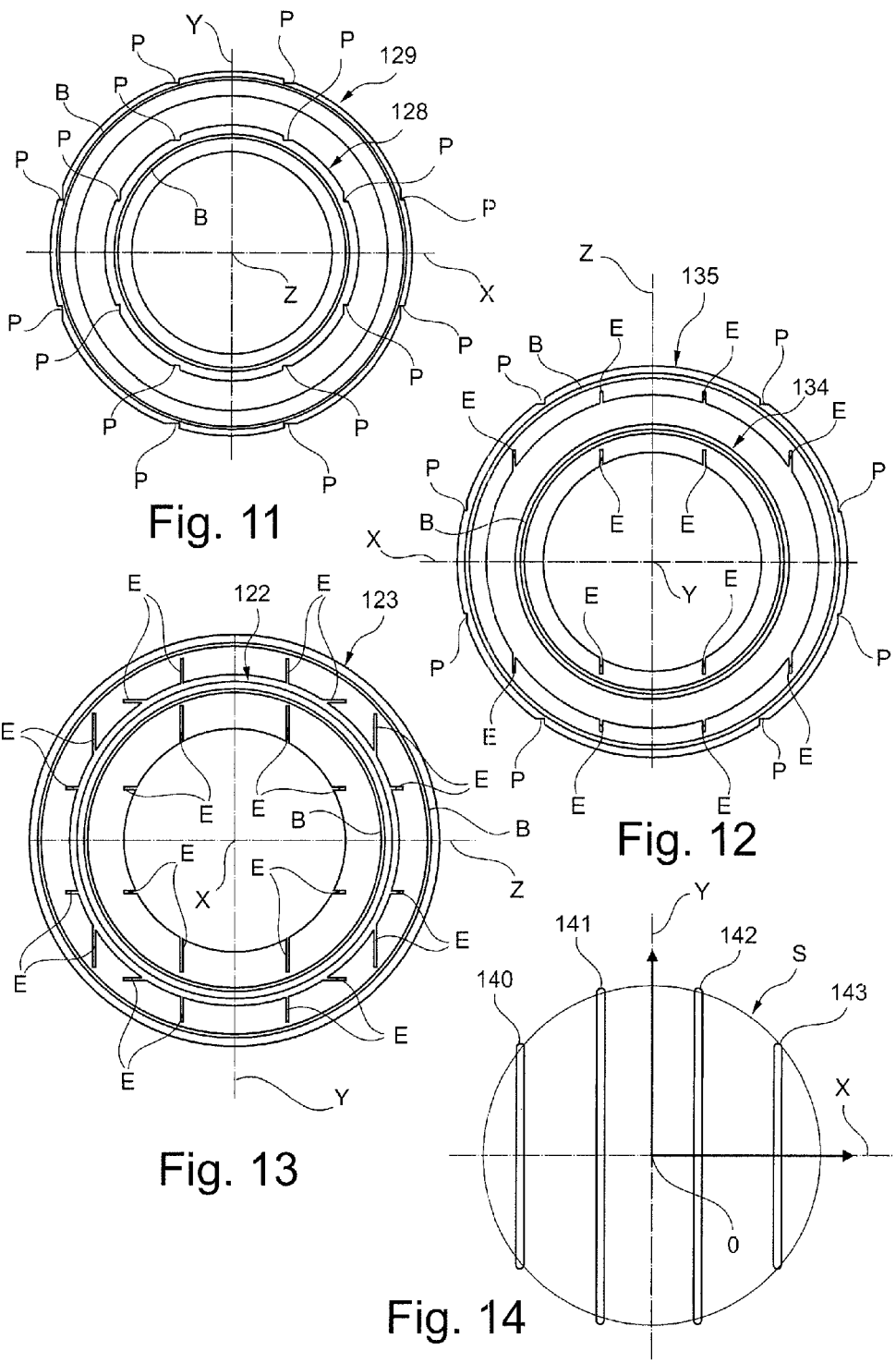

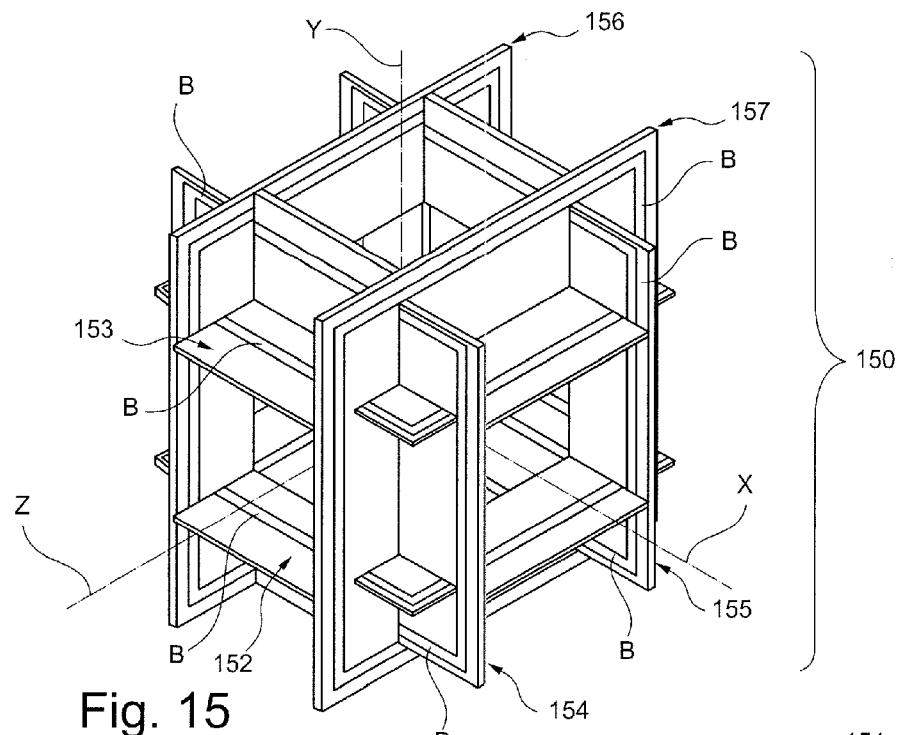
Fig. 15
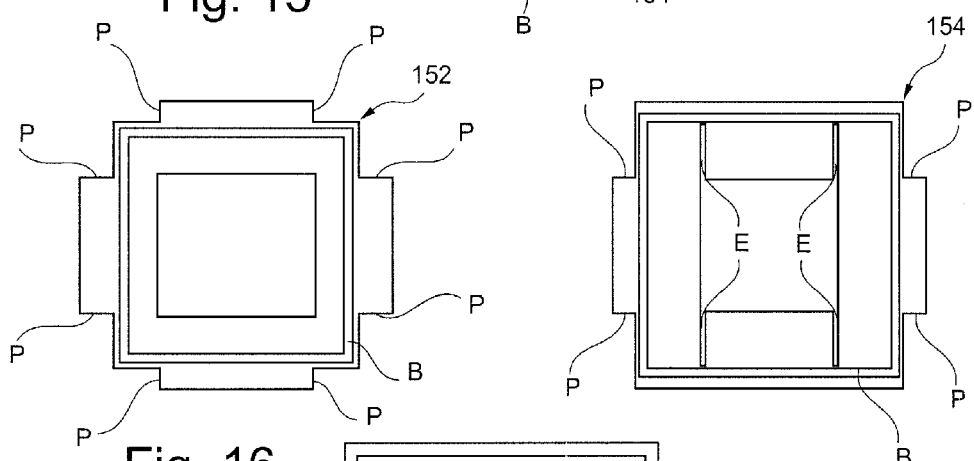
Fig. 16
Fig. 17
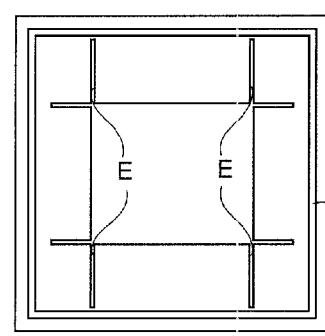
Fig. 18

GENERATOR OF A HOMOGENOUS MAGNETIC FIELD

RELATED APPLICATIONS

Under 35 USC 119, this application claims the benefit of the priority date of French application FR 1,157,949, filed on Sep. 7, 2011, the contents of which are herein incorporated by reference.

FIELD OF DISCLOSURE

The invention pertains to a generator of a magnetic field that is homogenous in a sphere centered on a central point as well as a magnetic field sensor incorporating this generator.

BACKGROUND

Prior-art generators comprise at least one first coil, one second coil and one third coil wound respectively about a first, second and third winding axes, the first and second and third winding axes being mutually orthogonal and secant at a common point corresponding to the central point, the coil or coils wound around a same winding axis being laid out along this winding axis so that a plateau of intensity of the magnetic field generated by this coil or these coils occurs at a central point when this coil or these coils are crossed by a same current.

When the plateau of intensity of the magnetic fields generated along each of the three orthogonal axes occurs at a central point, it is said that the magnetic field is homogenous. More specifically, a homogenous magnetic field is a field for which at least the first derivative is zero at the level of the central point. When only the first derivative is zero, it is called a second-order homogenous field because the first non-zero derivative in the Taylor series decomposition of the magnetic field at the central point is the one corresponding to the second derivative.

Here below, a magnetic field is said to be $N^{th}$-order homogenous when the first non-zero derivative in the Taylor series decomposition of the magnetic field at the central point is the one corresponding to the $(N-1)^{th}$ derivative.

Here below, the term "$N^{th}$-order generator" also designates a generator of a $N^{th}$-order homogenous magnetic field.

When the generator generates a homogenous magnetic field in all three orthogonal directions at the same central point, the magnetic field is homogenous within a sphere centered on this central point.

At present, the manufacturing of these generators is complicated because they are made by coiling wires into grooves made in a sphere made of electrically insulating materials.

The prior art is also known from DE10148288A1, JP2005294537A, JP2002232182A, EP2259081A1, EP1873543A1, and EP1481637A1.

This prior art describes a layout of coils that are more simple to make but for which the magnetic field is not as homogenous as the one generated by more complex generators. Furthermore, their space requirement is generally fairly great.

SUMMARY

The invention seeks to overcome this drawback by proposing a generator of a magnetic field that is more homogenous while at the same time maintaining a space requirement that is as small as possible. An object of the invention therefore is a generator compliant with claim 1.

The above generator also makes it possible to obtain an eighth-order homogenous magnetic field while the generators described in the prior art introduced here above make it possible, at best, to generate a fourth-order homogenous magnetic field. Furthermore, because the circumference of the coils is inscribed in proximity to a sphere centered on the central point, the generator remains very compact and has low space requirement.

The embodiments of this generator may comprise one or more of the characteristics of the dependent claims.

These embodiments of the generator furthermore have the following advantages:

- Notches and shoulders in each printed circuit make it possible for the printed circuits, in addition to fulfilling the carrier function of the electrical tracks, to be positioned with precision relatively to one another, thus simplifying the joining and manufacture of the homogenous field generator;
- setting up a series connection between different coils wound around a same winding axis simplifies the making and use of the generator;
- making notches in the printed circuits of a second coil and shoulders in the board of a printed circuit of a first coil makes it possible to lock the printed circuit of the first coil in the assembled position in a simple way without its being necessary to use other fastening means;
- making notches in the board of the printed circuit of a third coil and the corresponding shoulders in the board of a printed circuit of the second coil makes it possible to simply lock the printed circuits of the second coil in the assembled position without its being necessary to use other fastening means.

An object of the invention is also a sensor of a magnetic field.

A sensor of this kind has a precision that is very distinctly greater than that of the magnetic field sensor using compensation coils wound around respective magnetic fields to work in a zero field within these magnetic cores.

The embodiments of this sensor also offers the advantage that making the coils of a transducer in the same printed circuit as that used to make the coils of the generator limits the number of printed circuits used and therefore simplifies the manufacture of the sensor.

BRIEF DESCRIPTION OF THE DRAWINGS

The invention shall be understood more clearly from the following description, given purely by way of a non-exhaustive example and made with reference to the drawings, of which:

FIG. 1 is a schematic illustration of a magnetic field sensor;

FIG. 2 is a schematic illustration in perspective of a first embodiment of a homogenous magnetic field generator that can be used in the sensor of FIG. 1 enabling a simple illustration of the assembly of such a generator;

FIGS. 3 to 5 each represent a respective printed circuit used to make the generator of FIG. 2;

FIGS. 6 and 7 are schematic illustrations of steps of assembling the generator of FIG. 2;

FIG. 8 is a schematic illustration of the positioning of the coils relatively to the others in the generator of FIG. 2;

FIG. 9 is a graph representing changes in the magnetic field as a function of the distance between itself and a central point O;

FIG. 10 is a schematic illustration in perspective of a second embodiment of a generator which can be used in the sensor of FIG. 1;

FIGS. 11 to 13 are schematic illustrations of printed circuits of the generator of FIG. 10;

FIG. 14 is a schematic illustration of the positioning of the coils of the generator of FIG. 10;

FIG. 15 is an illustration in perspective of a third embodiment of a generator liable to be used in the sensor of FIG. 1;

FIGS. 16 to 18 are schematic illustrations of printed circuits used to make the generator of FIG. 15;

In these figures, the same references are used to designate the same elements.

DETAILED DESCRIPTION

Figure 19:
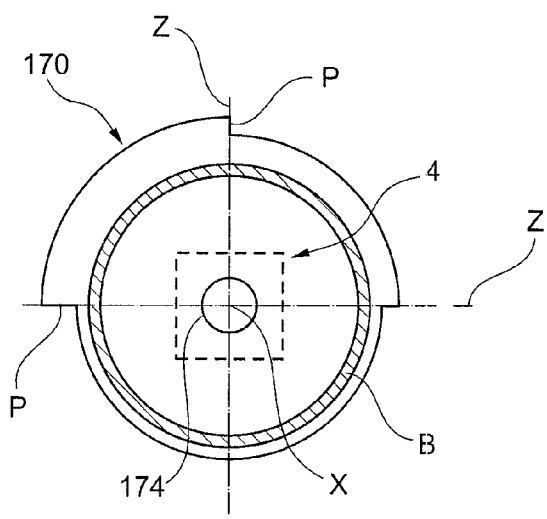
FIGS. 19 to 21 are schematic illustrations of printed circuits that can be used to make a fourth embodiment of a generator liable to be used in the sensor of FIG. 1.

Here below in this description, the characteristics and functions well known to those skilled in the art are not described in detail.

In this description, a printed circuit board or PCB is a carrier used for the electrical connection of a set of electrical components. Such a printed circuit board generally takes the form of a stratified or laminated plate. This printed circuit board may be a single-layer or multilayer printed circuit board. A single-layer printed circuit board has only one metallization layer in which there are printed conductive tracks that electrically connect the different electrical components to one another. A multilayer printed circuit board on the contrary has several metallization layers, i.e. at least two layers and, preferably, more than four or six layers.

A metallization layer is one of the layers of the stratified plate forming the printed circuit board in which one or more conductive tracks are made, electrically connecting the different electrical components to one another. This layer is flat and extends in parallel to the plane of the stratified plate. Generally, the metallization layer is obtained by depositing a uniform layer of a conductive material, typically a metal such as copper, and then etching this uniform layer to allow only the conductive tracks to remain.

The different metallization layers of the printed circuit board are mechanically spaced out from one another by insulating layers made of an electrically insulating material. This insulating material has high dielectric rigidity, i.e. typically greater than 3 MV/m and preferably greater than 10 MV/m. For example, the electrically insulating material is made of epoxy resin and/or fiberglass. The insulating layer generally takes the form of a rigid plate made of a material that does not become viscous when it is joined with other layers. For example, it is made of a thermosetting resin which has already undergone irreversible thermosetting.

The different layers of the multilayer printed circuit board are joined to one another without any degree of freedom by means of adhesive layers known as "pre-impregnated" layers and more generally known as "prepreg" layers.

The conductive tracks of the different metallization layers can be electrically connected by means of conductive pads passing through the insulating layers. The conductive pads are more generally known as "vias" or 'via holes". The vias generally extend perpendicularly to the plane of the layers. There are different ways of making these vias. One of the most common ways is to make a hole in the insulating layer or layers to be crossed and then to coat the inner wall of these holes with a metal. They are then referred to as metallized holes.

FIG. 1 shows a triaxial sensor 2 of a magnetic field. More specifically, this sensor 2 measures the intensity of the magnetic field along three axes X, Y and Z that are mutually orthogonal and secant at a central point O. The sensor 2 measures the orthogonal projection of the magnetic field on each of the axes X, Y and Z.

Here, the sensor 2 is a fluxgate sensor. It comprises:
- a triaxial transducer 4 capable of converting the magnetic field into voltages, and
- a voltage processing unit 6 for processing voltages generated by the transducer 4.

The transducer 4 typically comprises:
- at least three saturable magnetic bars extending respectively along the axes X, Y and Z,
- excitation coils wound around each of these bars to saturate them periodically,
- measurement coils to measure the magnetic field in each of these bars.

Certain bars can be magnetically connected to one another to form a magnetic ring. For example, the transducer 4 is identical to the transducer described in the french patent application filed on Sep. 7, 2011 by the Commissariat a l'énergie atomique et aux énergies alternatives and entitled "Printed circuit board" (filing number: FR 1157933) with reference to FIG. 1 except that the compensation coil is omitted.

The processing unit 6 controls the powering of the excitation coils and processes the measurements of the measurement coils to therefrom deduce the intensity of the magnetic field along the axes X, Y and Z.

The sensor 2 also has a controllable generator 8 for generating the homogenous magnetic field. This generator 8 generates a homogenous magnetic field within a sphere of homogeneity 10. This sphere 10 is the sphere centered on the point O within which the magnetic field is homogenous in the desired direction and for which the three components are adjustable in the three axes X, Y and Z.

The transducer 4 and especially the three magnetic bars are placed within this sphere 10.

Here, the generator 8 is made by means of compensation coils wound respectively about the three axes X, Y and Z. Embodiments of this generator 8 are described in greater detail with reference to the following figures.

The processing unit 6 is also capable of controlling the generator 8 according to the magnetic field measured along the axes X, Y and Z to generate, by means of the generator 8, a magnetic compensation field which cancels out the measured magnetic field. Thus, through the magnetic compensation field, the magnetic field within the magnetic bars of the transducer 4 is substantially zero. In other words, the generator 8 replaces the compensation coils described in the patent application filed under number FR1157933. Thus, the measurement of the intensity of the magnetic field along the axes X, Y and Z is obtained from the intensity of the current that flows in the compensation coils of the generator 8.

FIG. 2 represents a fourth-order generator 20 that can be used as a generator 8. This generator 20 is used here to provide a description, taking a simple example, of an advantageous technique for manufacturing a generator of this kind. This same technique is used to manufacture the other generators described with reference to the following figures. In the FIG. 2, this generator 20 is represented in an assembled position.

The generator 20 comprises:
- a pair of coils 22, 23 wound around the axis X,
- a pair of coils 26, 27 wound around the axis Y, and
- a pair of coils 28, 29 wound around the axis Z.

Each coil has at least one turn and preferably several turns.

Here, each pair of coils forms a pair of coils known as Helmholtz coils so as to generate a fourth-order homogenous magnetic field between these two coils in their winding axis.

For example, the circumference of the turns of the coils forms a circle centered to their winding axis. Furthermore, the two coils of the same pair have the same number of turns.

The coil 22 is the symmetric of the coil 23 relatively to the plane YZ, i.e. relatively to the plane containing the axes Y and Z. Similarly, the coils 26 and 28 are the symmetrics, respectively, of the coils 27 and 29 in relation respectively to the planes XZ and XY.

To form the coils 22, 23 and 26 to 29, the generator comprises six printed circuits respectively 32, 33 and 36 to 39. Each printed circuit 32, 33 and 36 to 39 comprises an annular card, 42, 43 and 46 to 49 respectively forming a rigid carrier for electrical tracks. The term "rigid" designates for example a board for which the Young's modulus at 25° C. is greater than 2 GPa and preferably greater than 4 or 10 or 50 GPa.

The printed circuit may be a single-layer or multilayer printed circuit.

Circular electrical tracks are made in the metallization layers of each of the printed circuits to form turns, respectively, for the coils 22, 23 and 26 to 29. For example, these tracks are etched in the metallization layers of the different boards of the different printed circuits.

FIGS. 3 to 5 give a more detailed view respectively of the printed circuits 32, 36 and 38. The printed circuits 33, 37 and 39 are respectively deduced from the printed circuits 32, 36 and 38 by symmetry.

In these figures, the orthogonal projections of the axes X, Y and Z on the plane of the printed circuit bear the same numerical references. The axis perpendicular to the plane of the printed circuit is represented by a black dot at the centre of this printed circuit.

The internal periphery of the board 42 is a circle centered on the axis X. Its external periphery is also a circle centered on the axis X but in which the shoulders have been cut out. Here, the board 42 comprises:

two shoulders 60, 61 which are to abut the board 47 in the assembled position,
two shoulders 64, 65 which are to abut the board 46 in the assembled position,
two shoulders 68, 69 which are to abut the board 49 in the assembled position, and
two shoulders 72, 73 which are to abut the board 48 in the assembled position.

The shoulders 60, 64, 68 and 69 are the symmetrics, respectively, of the shoulders 61, 65, 72 and 73 relatively to the plane YX. The shoulders 60, 61, 68 and 72 are also the symmetrics respectively of the shoulders 64, 65, 69 and 73 relatively to the plane ZX.

The spacing between the shoulders 60 and 64 and the shoulders 61 and 65 is chosen to position the coils 26 and 27 at a distance from one another making it possible to obtain a homogenous magnetic field along the axis Y. This distance is described in greater detail with reference to FIGS. 8 and 9.

Similarly, the spacing between the shoulders 68, 72 and the shoulders 69, 73 is chosen to position the coils 28, 29 at a distance from one another making it possible to obtain a homogenous magnetic field along the axis Z.

The shoulders also make it possible to position the different coils of the generator 20 precisely and simply at right angles.

FIG. 4 represents the printed circuit 36. The inner periphery of this printed circuit is circular and centered on the axis Y. Notches 80 to 83 are cut out in this internal circular periphery. The notches 80 and 82 are the symmetrics of the notches 81 and 83 relatively to the plane YZ. The notches 80 and 81 are the symmetrics of the notches 82 and 83 relatively to the plane XY. The notches 80, 81 and 82, 83 receive, slidingly, during the assembling of the generator 20, respectively, the boards 42 and 43. To this end, the width of each notch in the direction parallel to the axis X ranges from e to 2e and preferably from e+5 µm to e+300 µm, where e is the thickness of the boards used to make the generator 30. Preferably, each notch is deeper than it is wide.

Here, each notch immobilizes the board 42 or 43 received in this notch in translation in the direction X.

The circular external periphery of the circuit 36 is centered on the axis Y. Shoulders 86 to 89 are cut out in this external periphery to position the printed circuits 48 and 49. More specifically, the shoulders 86, 87 abut the board 49 in the assembled position. The shoulders 88 and 89 for their part abut the board 48 in the assembled position.

The shoulders 86 and 87 are the symmetrics of the shoulders 88 and 89 relatively to the plane YZ. The shoulders 86 and 88 are the symmetrics of the shoulders 87 and 89 relatively to the plane XY.

The spacing between the shoulders 86, 88 and the shoulders 87, 89 is chosen to position the coils 28, 29 at a distance from one another enabling the generation of a homogenous magnetic field along the axis Z.

FIG. 5 represents the printed circuit 38. Its circular internal periphery is centered on the axis Z. Notches 90 to 97 are cut out in this internal periphery. These notches fulfill a similar function and are made similarly to what was described earlier for the notches of the printed circuit 36. Here, the notches 92, 93, 94 and 96 are the symmetrics respectively of the notches 90, 91, 95 and 97 relatively to the plane YZ. The notches 90, 92, 94 and 95 are the symmetrics, respectively, of the notches 91, 93, 96 and 97 relatively to the plane XZ.

The notches 90, 91 and the notches 92, 93 receive respectively the boards 42 and 43 slidingly, during assembly.

The notches 94, 95 and the notches 96, 97 receive the boards 47 and 46 respectively slidingly during assembly.

The notches 90 to 97 enable the printed circuits 32, 33 and 36, 37 to be locked in translation along the axes X and Y.

FIG. 6 represents the first step of assembling of the generator 20. More specifically, FIG. 6 resembles the disassembled position of the generator 20. To start the assembly, the printed circuits 32 and 33 are assembled with the printed circuits 36 and 37 by translation along the arrows F1. To this end, the printed circuits 32 and 33 are inserted respectively within pairs of notches 80, 81 and 82, 83 of the printed circuits 36 and 37. During this operation, the printed circuits 36 and 37 abut the corresponding shoulders made in the circuits 32 and 33.

FIG. 7 represents the next step of assembling during which the printed circuits 38 and 39 are assembled on the previous printed circuits. To this end, the circuits 38 and 39 are shifted in translation along the direction of the arrows F2. Then, after this translation, we obtain the generator 20 in the assembled position. In this position, the circuits 38 and 39 lock the circuits 32, 33, 36 and 37 in position. Glue points are used for the fixing, without any degree of freedom, of the printed circuits 38 and 39 to the other printed circuits. These glue points therefore make it possible to lock the generator 20 in the assembled position.

FIG. 8 represents the spacing between the coils 22 and 23. The spacing between the other pairs of coils is chosen identically. Here, the distance D along the axis X which separates the coils 22 and 23 is equal to the radius R of these coils. Thus, the magnetic field generated by the coils 22 and 23 has fourth-order homogeneity within the sphere 10. The configuration is also known as the Helmholtz coil configuration.

Here, the spacing between the two coils wound on a same axis is fixed by the spacing between the shoulders on which the printed circuits rest. The spacing between the shoulders is therefore chosen so that each pair of coils forms a Helmholtz coil.

The circumferences of the coils 22 and 23 are recorded in a sphere S centered on the point O. In this configuration, the space requirement of the generator 20 is minimized.

FIG. 9 represents the progress of the intensity of the magnetic field along the axis X as a function of the distance from the centre in different cases where a homogenous magnetic field is generated at the central point O.

The curve 102 represents the case of a single circular coil contained in the plane YZ. The curves 104 and 106 represent the case respectively of two coils and four coils. As illustrated, by using a larger number of coils, it is possible to generate a more homogenous magnetic field. For example, here, a single coil centered on the point O enables solely the generation of a second-order homogenous magnetic field. However, two coils enable the generation of a fourth-order homogenous magnetic field. Finally, four coils enable the generation of an eighth-order homogenous magnetic field.

FIG. 10 represents an eighth-order generator 120 in the assembled position. This generator 120 is liable to be used as a generator 8 in the sensor 2. It is made according to the same principle as a generator 20 but has additional coils to generate an eighth-order homogenous magnetic field.

To this end, the generator 120 comprises:
 four annular printed circuits 122 to 125 centered on the axis X positioned symmetrically relatively to the plane YZ,
 four annular printed circuits 128 to 131 centered on the axis Z, positioned symmetrically relatively to the plane XY, and
 four annular printed circuits 134 to 137 centered on the axis Y, positioned symmetrically relatively to the plane XZ.

FIGS. 11 to 13 give a more detailed view of the printed circuits 122, 123, 128, 129, 134 and 135. The other printed circuits of the generator 120 can be deduced from these printed circuits by symmetry relatively to the planes XY, XZ or YZ.

As in the case of the generator 20, each printed circuit comprises a rigid board in which electrical tracks are made forming the turns of the coils and in which notches and/or shoulders are cut out to position these printed circuits relatively to one another. In FIGS. 11 to 13 and the following figures, the coils bear the reference B, the notches bear the reference E and the shoulders bear the reference P.

The notches E and the shoulders P are at a distance from one another so that the coils are placed in a position where the magnetic field generated is homogenous to the eighth order.

FIG. 14 represents the position, along the axis X, of the circular coils 140 to 143 etched in the metallization layers of the printed circuits 122 to 125. The position $C_X$ along the axis X and the radius $R_Y$ of each coil to obtain an eighth-order homogenous magnetic field are determined by computation using the magnetostatic equations. Since the number of solutions is infinite, the solution selected in this configuration is the one that verify the following two additional constraints:
 1) the circumference of each coil must be as close as possible to the periphery of a sphere S of a chosen radius centered on the point O, and
 2) for a current of unit intensity flowing in the coils 141 and 142, the intensity of the current enabling an eighth-order homogenous magnetic field flowing in the end coils 140 and 143 must be a rational fraction of the unit current.

The condition 1) increases the compactness of the generator 120. The constraint 2) gives a number of turns in each coil 140 to 143 that is an integer. For a sphere with unit radius, the position $C_X$ and the radius $C_Y$ of each coil 140 to 143 are given in the following table:

|  | Numerical reference of the coil | | | |
| --- | --- | --- | --- | --- |
|  | 140 | 141 | 142 | 143 |
| $C_X$ | −0.764 | 0.287 | 0.287 | 0.764 |
| $C_Y$ | 0.641 | 0.961 | 0.961 | 0.641 |

With these values, the divergence between the diameters of the coils and the diameters of the circle corresponding to the intersection between the plane of the printed circuit of the coil and the sphere S is smaller than 2% and in this case smaller than or equal to 0.5%. The divergence is given by taking as a reference the diameter of the sphere S.

The intensity of the current and the coils 140 and 143 is reduced by a third as compared with the intensity of the current flowing in the coils 141 and 142 to obtain an eighth-order homogenous magnetic field. This means that, to achieve this configuration, the coils 140 to 143 are series-connected to be crossed by the same compensation current. The number of turns of the coils 141, 142 is then chosen as being an integer multiple of three. In these conditions, the number of turns of the coils 140 and 143 is also an integer. It is deduced from the number of turns of the coils 141, 142 in multiplying this number by ⅔. For example, the coils 141 and 143 are formed by only three turns and the coils 140 and 143 are formed by only two turns. Such a choice also enables the making of the generator.

FIGS. 15 to 18 represent a fourth-order generator 150 identical to the generator 20 but made by using square-sectioned coils. Here, this generator 150 has six printed circuits 152 to 157 having a square-shaped external perimeter and an internal perimeter that is also square shaped. As in the above embodiments, the positioning of the printed circuits relatively to one another is obtained by a cooperation of shape between notches E and shoulders P cut out on the periphery of the boards of these printed circuits.

Since the coils are square-shaped, the spacing between the different coils to obtain a fourth-order homogenous magnetic field is not exactly the same as that used when the coils are circular. It has been computed, from the magnetostatic equations, that the spacing between the square-shaped coils can be deduced from the spacing or distance D between the circular coils in multiplying the latter spacing by 1.089.

Figure 21:
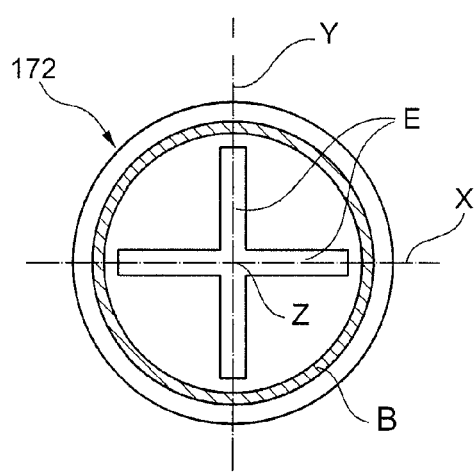
Figure 20:
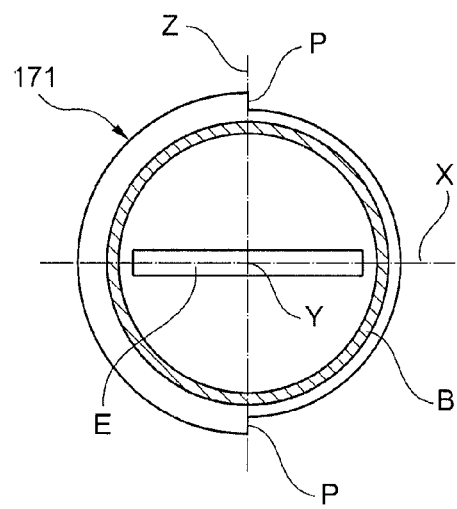

FIGS. 19 to 21 represent three printed circuits 170 to 172 used to make a second-order generator. In this case, the three coils of the three printed circuits are concentric and accept the same central point O as their center. Each of these coils is placed in a plane perpendicular to the planes of the other two coils. In this embodiment, the notches E are rectangles cut out at the center of the boards of the printed circuits 171 and 172 to receive the board of another printed circuit slidingly. Thus, in the assembled position, the printed circuit 170 is received inside the notch E of the circuit 171, and the assembly of the circuits 170 and 171 is received inside the notches E of the circuit 172.

Furthermore, in this embodiment, turns 174 of at least one of the coils of the transducer 4 are formed by conductive tracks made in the metallization layers of the printed circuit 170 so as to facilitate the manufacture of the sensor.

Many other embodiments are possible. For example, the numerous turns of a same coil can be made in a same metallization layer of a printed circuit or in respective metallization layers stacked on one another. In this case, typically, the different turns are connected by vias. Whatever the order of the generator, it is possible to use square-shaped turns instead of circular turns. Other shapes of turns are also possible.

The bonding of the printed circuits to one another can be done by means other than glue. For example, a solder point can be used to attach the printed circuits to one another. This solder point can be made to attach zones reserved for this use.

As a variant, the number of coils along each axis is different.

Generators of a higher order higher than the eighth can also be made by adding coils and therefore printed circuits.

It will be noted that a sixth-order generator can be made by positioning three coils along each axis X, Y and Z. One of the three coils is included in a plane passing through the point O.

As a variant, the printed circuits used to make the coils of the generator can be positioned relatively to one another without resorting to notches or shoulders. For example, the printed circuits are positioned relatively to one another by hand or by means of a robot and then attached to one another, without any degree of freedom, by fastening means such as glue or a solder point.

In another variant, the turns of the coils are not made by electrical tracks of a printed circuit. For example, the turns of the coils are obtained by coiling a wire in circular notches made on the periphery of a globe made of a non-magnetic material.

The invention claimed is:

1. An apparatus comprising a magnetic field generator for generating a magnetic field that is homogenous within a sphere centered on a central point, said generator comprising at least one first coil, one second coil and one third coil wound respectively about first, second and third winding axes, said first, second, and third winding axes being mutually orthogonal and secant at a common point corresponding to said central point, a coil or coils wound around a common winding axis being laid out along said winding axis so that a plateau of intensity of a magnetic field generated by said coil or coils occurs at said central point when said coil or coils are crossed by a same current, at least four coils wound around each of said winding axes, said four coils forming two pairs of coils, wherein first and second coils of a pair are symmetric relative to a plane of symmetry perpendicular to said winding axis and passing through said central point, said four coils being spaced from one another to cancel at least a first derivative up to a seventh derivative of a magnetic field generated by said coils, in parallel to the winding axis, at said central point when said coils are powered by the same current, and wherein said coil defines a circle having a diameter that is equal, within 2%, to a diameter of a circle defined by an intersection between a sphere centered on said central point and a plane, perpendicular to a winding axis of said coil, passing through said coil, said sphere being the same for all coils wound around the same winding axis.

2. The apparatus of claim 1, wherein different coils wound about a common winding axis are electrically series-connected and positioned along said common winding axis so that each coil has an integer number of turns.

3. The apparatus of claim 1, wherein said magnetic field generator further comprises, for each coil, a printed circuit comprising electrical tracks forming turns of said coil, said printed circuit comprising a rigid board forming a carrier for said electrical tracks.

4. The apparatus of claim 3, wherein said rigid board further comprises at least one notch shaped to cooperate with a shoulder of an other rigid board of an other printed circuit to position said other printed circuit relative to said rigid board in a position where said plateau of intensity of said magnetic field generated by said coils occurs at a level of said central point when said coils are crossed by a same current.

5. The apparatus of claim 4, wherein a rigid board of a printed circuit of said second coil comprises a notch for sliding reception of a rigid board of a printed circuit of said first coil, and a rigid board of said printed circuit of said first coil comprises a shoulder for abutting a rigid board of said printed circuit of said second coil when said rigid board of said printed circuit of said first coil slides in said notch of said rigid board of said printed circuit of said second coil.

6. The apparatus of claim 5, wherein a rigid board of a printed circuit of said third coil comprises notches for sliding reception of said rigid board of said printed circuit of said second coil, and sad rigid board of said printed circuit of said second coil comprises shoulders capable of abutting said rigid board of said printed circuit of said third coil when said rigid board of said printed circuit of said second coil slides in said notches of said rigid board of said printed circuit of said third coil.

7. The apparatus of claim 6, wherein each notch is demarcated by two parallel edges separated from one another by a distance that ranges between a thickness of a rigid board to be received in said notch and twice said thickness.

8. An apparatus comprising a magnetic field sensor, said magnetic field sensor comprising a controllable magnetic field generator configured to generate a homogenous magnetic field having a plateau of intensity, in three orthogonal directions, that occurs at a central point, wherein said controllable magnetic field generator comprises at least one first coil, one second coil and one third coil wound respectively about first, second and third winding axes, said first and second and third winding axes being mutually orthogonal and secant at a common point corresponding to said central point, a coil or coils wound around a common winding axis being laid out along said winding axis so that a plateau of intensity of a magnetic field generated by said coil or coils occurs at said central point when said coil or coils are crossed by a same current, at least four coils wound around each of said winding axes, said four coils forming two pairs of coils, wherein first and second coils of a pair are symmetric relative to a plane of symmetry perpendicular to said winding axis and passing through said central point, said four coils being spaced from one another to cancel at least a first derivative up to a seventh derivative of a magnetic field generated by said coils, in parallel to said winding axis, at said central point when said coils are powered by the same current, and wherein said coil defines a circle having a diameter that is equal, within 2%, to a diameter of a circle defined by an intersection between a sphere centered on said central point and a plane, perpendicular to a winding axis of said coil, passing through said coil, said sphere being the same for all coils wound around the same winding axis, a tri-axial transducer disposed at said central point and configured for converting an intensity of said magnetic field in said three orthogonal directions into respective voltages, and a control unit configured for controlling said controllable magnetic field generator as a function of a magnetic field measured by said tri-axial transducer to cancel a magnetic field measured at said central point.

9. The apparatus of claim 8, wherein said tri-axial transducer comprises at least one measuring coil to measure a magnetic field along at least one of said three directions and said controllable magnetic field generator comprises a printed circuit comprising electrical tracks forming turns of said measuring coil and other electrical tracks forming turns of a coil of said controllable magnetic field generator.

* * * * *